United States Patent
Yamashita et al.

(10) Patent No.: US 10,985,065 B2
(45) Date of Patent: Apr. 20, 2021

(54) METHOD OF DICING A WAFER BY PRE-SAWING AND SUBSEQUENT LASER CUTTING

(71) Applicant: DISCO CORPORATION, Tokyo (JP)

(72) Inventors: Yohei Yamashita, Tokyo (JP); Tsubasa Obata, Tokyo (JP); Yuki Ogawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 80 days.

(21) Appl. No.: 15/799,282

(22) Filed: Oct. 31, 2017

(65) Prior Publication Data

US 2018/0130709 A1    May 10, 2018

(30) Foreign Application Priority Data

Nov. 4, 2016 (JP) .............................. JP2016-216571

(51) Int. Cl.
| | |
|---|---|
| *H01L 21/78* | (2006.01) |
| *H01L 21/268* | (2006.01) |
| *H01L 21/683* | (2006.01) |
| *H01L 23/544* | (2006.01) |

(52) U.S. Cl.
CPC .......... *H01L 21/78* (2013.01); *H01L 21/2686* (2013.01); *H01L 21/6836* (2013.01); *H01L 23/544* (2013.01); *H01L 2221/6834* (2013.01); *H01L 2221/68327* (2013.01); *H01L 2223/5446* (2013.01)

(58) Field of Classification Search
CPC . H01L 21/78; H01L 21/2686; H01L 21/6836; H01L 2221/68327; H01L 23/544; H01L 2223/5446
See application file for complete search history.

(56) References Cited

U.S. PATENT DOCUMENTS

| | | | | |
|---|---|---|---|---|
| 2005/0170616 | A1* | 8/2005 | Murata | ............... H01L 21/3043 438/463 |
| 2008/0242052 | A1* | 10/2008 | Feng | ................... H01L 21/3043 438/459 |
| 2009/0294913 | A1* | 12/2009 | Kawashima | ......... B28D 5/0011 257/620 |
| 2018/0331492 | A1* | 11/2018 | Itoh | ..................... H01S 5/02228 |

FOREIGN PATENT DOCUMENTS

JP    2005-064231    3/2005

\* cited by examiner

*Primary Examiner* — Brigitte A Paterson
(74) *Attorney, Agent, or Firm* — Greer Burns & Crain Ltd.

(57) ABSTRACT

A wafer processing method includes a protective member laying step of placing a protective member on a face side of a wafer, a reverse side grinding step of grinding a reverse side of the wafer to thin the wafer, a cut groove forming step of positioning a cutting blade in alignment with projected dicing lines one at a time on the reverse side of the wafer, cutting the wafer with the cutting blade to form cut grooves in the wafer which terminate short of the face side thereof, and a cutting step of applying a laser beam to the wafer from the reverse side thereof along the cut grooves to completely sever the wafer along the projected dicing lines into individual device chips.

2 Claims, 6 Drawing Sheets

METHOD OF DICING A WAFER BY PRE-SAWING AND SUBSEQUENT LASER CUTTING

BACKGROUND OF THE INVENTION

Field of the Invention

The present invention relates to a method of processing a wafer that has been demarcated into a plurality of devices by a plurality of projected dicing lines, to divide the wafer into individual device chips.

Description of the Related Art

Wafers in which a plurality of devices such as integrated circuits (ICs), large-scale integration (LSI) circuits, etc. are formed in respective areas demarcated on their face sides by projected dicing lines known as streets are diced by a cutting blade of a dicing apparatus into individual device chips, which will be used in electronic appliances including mobile phones, personal computers, etc. In recent years, there have been known attempts to make those devices faster in operation by forming a plurality of low-dielectric-constant insulating films, also known as low-k films, as inter-layer insulating films on the face sides of semiconductor substrates such as silicon wafers, thereby producing functional layers which will be made into ICs and LSI circuits. Since a low-k film is deposited on the entire face side of a wafer, it covers projected dicing lines or streets on the wafer. When the wafer is diced along the streets by the cutting blade, the low-k film on the streets is also cut by the cutting blade, and flakes off like something made of mica, tending to make resultant device chips lower in quality.

In view of the above difficulty, there has been proposed and put to practical use a processing method whereby a low-k film on a wafer is removed along streets thereon with a laser beam applied to the face side of the wafer, and then a cutting blade positioned on the areas from which the low-k film has been removed dices the wafer along the streets, dividing the wafer into individual device chips (see, for example, Japanese Patent Laid-open No. 2005-064231).

SUMMARY OF THE INVENTION

According to the processing method disclosed in Japanese Patent Laid-open No. 2005-064231, the problem caused when the low-k film on the projected dicing lines is removed directly by the cutting blade in the dicing process is solved. However, in order to remove the low-k film from the streets across a width wider than the cutting blade so that the cutting blade will not touch the remaining low-k film in the dicing process, it is necessary to form at least two laser-processed grooves along each of the streets. This leads to a reduction in productivity.

Furthermore, it has been found that other problems tend to arise out of the processing method disclosed in Japanese Patent Laid-open No. 2005-064231, as described below.

(1) Even though a laser grooving process is carried out to apply a laser beam to the face side of a wafer to remove a low-k film along streets, if the low-k film is not removed sufficiently, then a dicing blade may be displaced or slanted and unevenly worn when it dices the wafer in a subsequent dicing process.

(2) If a laser grooving process is performed on the face side of a wafer, then so-called debris is scattered around from the wafer, tending to lower the quality of resultant devices. The difficulty may be avoided by coating the wafer with a protective film, but the additional coating process results in a reduction in productivity.

(3) Since a plurality of laser beams are applied to the wafer to form at least two laser-processed grooves along each of the streets, thermal stresses are developed and remain in the wafer, possibly reducing the flexural strength of resultant devices.

(4) Inasmuch as laser-processed grooves are formed in a wafer across a width wider than a cutting blade, wide streets are required on the wafer. The wide streets reduce areas on the wafer where devices are to be formed, resulting in a reduction in the number of devices that can be produced from the wafer.

(5) A passivation film of SiN or $SiO_2$ is deposited on the upper surface of the low-k film in a wafer for protecting the inside of the wafer from ambient moisture and metal ions. When a laser beam is applied to the face side of the wafer, the laser beam travels through the passivation film to the low-k film, processing the low-k film. Therefore, heat generated by the low-k film is trapped by the passivation film and cannot escape from the low-k film. The trapped heat is liable to process the wafer laterally or develop an undercut in the wafer to tend to cause the low-k film to flake off, resulting in lowering the quality of the devices.

It is therefore an object of the present invention to provide a method of processing a wafer in which a plurality of inter-layer insulating films are deposited on the face side of the wafer, producing functional layers thereon, and a plurality of devices are formed in respective areas on the wafer which are demarcated by a plurality of projected dicing lines or streets, the method being capable of dividing the wafer efficiently into individual device chips without lowering the quality of the devices provided on the respective device chips.

In accordance with an aspect of the present invention, there is provided a method of processing a wafer that has been demarcated into a plurality of devices by a plurality of crossing projected dicing lines, to divide the wafer into individual device chips, including the steps of placing a protective member on a face side of a wafer, thereafter, grinding a reverse side of the wafer to thin the wafer, thereafter, peeling off the protective member from the face side of the wafer, applying an adhesive tape to the face side of the wafer, and applying an outer peripheral portion of the adhesive tape to an annular frame which has an opening for accommodating the wafer therein, so that the wafer is supported on the annular frame through the adhesive tape, thereafter, positioning a cutting blade in alignment with the projected dicing lines one at a time on the reverse side of the wafer, and cutting the wafer with the cutting blade to form cut grooves in the wafer which terminate short of the face side thereof, thereafter, applying a laser beam to the wafer from the reverse side thereof along the cut grooves to completely sever the wafer along the projected dicing lines into individual device chips, and thereafter, picking up the individual device chips from the adhesive tape supported on the annular frame.

According to the present invention, there is no need to form a plurality of laser-processed grooves in the face side of the wafer along each of the projected dicing lines, resulting in an increase in productivity and making the method of processing a wafer free of the problems of the background art described above. Furthermore, after the wafer has been divided into the individual device chips, a pick-up collet acts on the reverse sides of the devices to pick up the individual device chips, one at a time, from the adhesive tape and carries the picked-up device chip directly to a bonding step where the face side of the device chip is bonded to a wiring board. The above pick-up sequence is also effective to achieve an increase in productivity.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
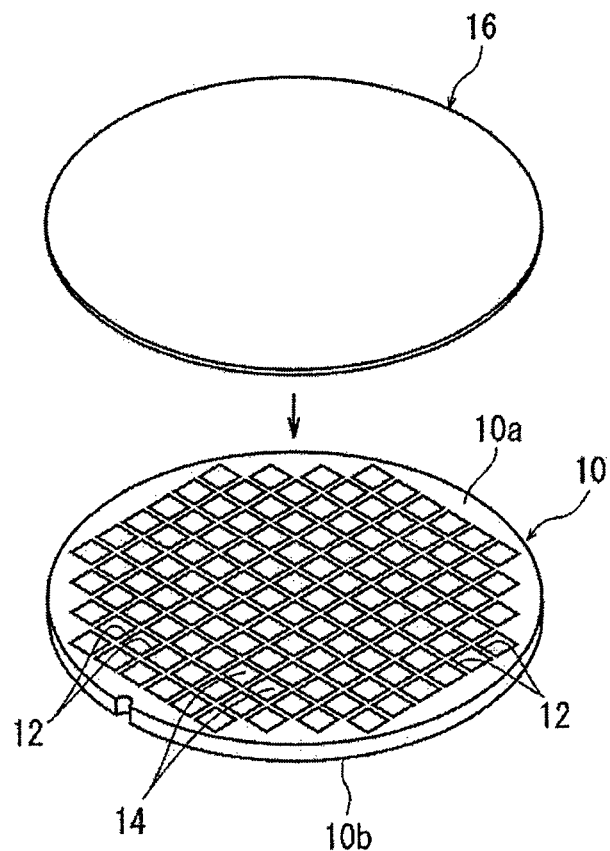
FIG. 1 is a perspective view illustrative of a protective member laying step.

A method of processing a wafer according to an embodiment of the present invention will be described in detail below with reference to the accompanying drawings. For carrying out the method of processing a wafer according to the present embodiment, as illustrated in FIG. 1, a protective tape 16 that serves as a protective member for protecting a face side 10a of a wafer 10 is applied to the face side 10a of the wafer 10 (protective member laying step). The wafer 10 includes a silicon substrate that is 700 μm thick, for example, and has a grid of projected dicing lines or streets 12 formed on its face side 10a and a plurality of devices 14 such as ICs, LSI circuits, etc. formed in respective areas demarcated on the face side 10a by the streets 12. The protective tape 16 may include a sheet-like base made of polyvinyl chloride (PVC) and coated on its surface with an adhesive of acrylic resin. However, the protective tape 16 is not limited to such materials, but may be made of any of various known materials as long as they are capable of protecting the face side 10a of the wafer 10 in a reverse side grinding step, described below, to be carried out subsequently.

Figure 2:
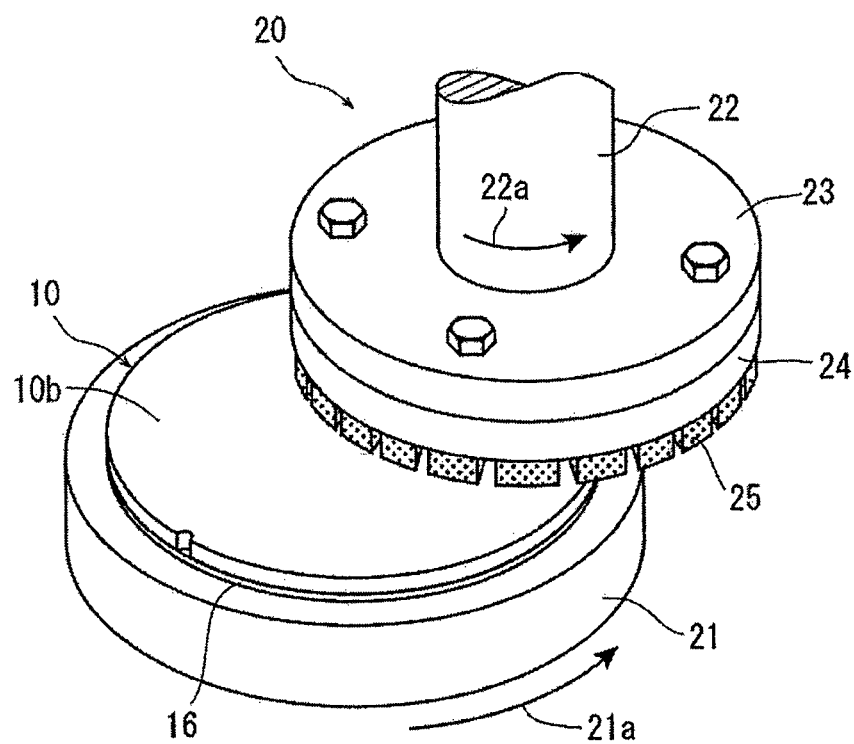
FIG. 2 is a perspective view illustrative of a reverse side grinding step.

After the protective member laying step, the reverse side grinding step is carried out. In the reverse side grinding step, as illustrated in FIG. 2, the wafer 10 is placed on a first chuck table 21 provided on grinding means 20 of a grinding apparatus, not illustrated in its entirety, while the face side 10a with the protective tape 16 applied thereto is facing downwardly and a reverse side 10b thereof, which is to be ground, is facing upwardly. The first chuck table 21 is rotatable about its own axis by a rotary actuating mechanism, not illustrated, and has a holding surface made of a porous material and connected to suction means, not illustrated. In the reverse side grinding step, the wafer 10 is firmly held under suction on the first chuck table 21 so that the wafer 10 is not positionally displaced thereon.

The grinding means 20 is arranged to grind the wafer 10 on the first chuck table 21 to a thin profile. Specifically, the grinding means 20 includes a vertically movable rotary spindle 22 rotatable about its own axis by a rotary actuating mechanism, not illustrated, a mounter 23 mounted on the lower end of the rotary spindle 22, and a grinding wheel 24 attached to the lower surface of the mounter 23. A plurality of grinding stones 25 are disposed in an annular array on the lower surface of the grinding wheel 24.

After the wafer 10 has been held under suction on the first chuck table 21, the first chuck table 21 is rotated about its own axis at a rotational speed of 300 rpm, for example, in the direction indicated by the arrow 21a in FIG. 2, while at the same time the grinding wheel 24 is rotated about its own axis at a rotational speed of 6000 rpm, for example, in the direction indicated by the arrow 22a in FIG. 2. Then, the grinding stones 25 are lowered into contact with the reverse side 10b of the wafer 10, and thereafter displaced, i.e., grinding-fed, downwardly perpendicularly to the first chuck table 21 at a grinding-feed rate of 1 μm/second, for example. At this time, the wafer 10 is ground while its thickness is being measured by a contact-type measurement gage, not illustrated. When the reverse side 10b of the wafer 10 has been ground to bring the wafer 10 to a thickness of 200 μm, for example, the reverse side grinding step is completed.

Figure 3:
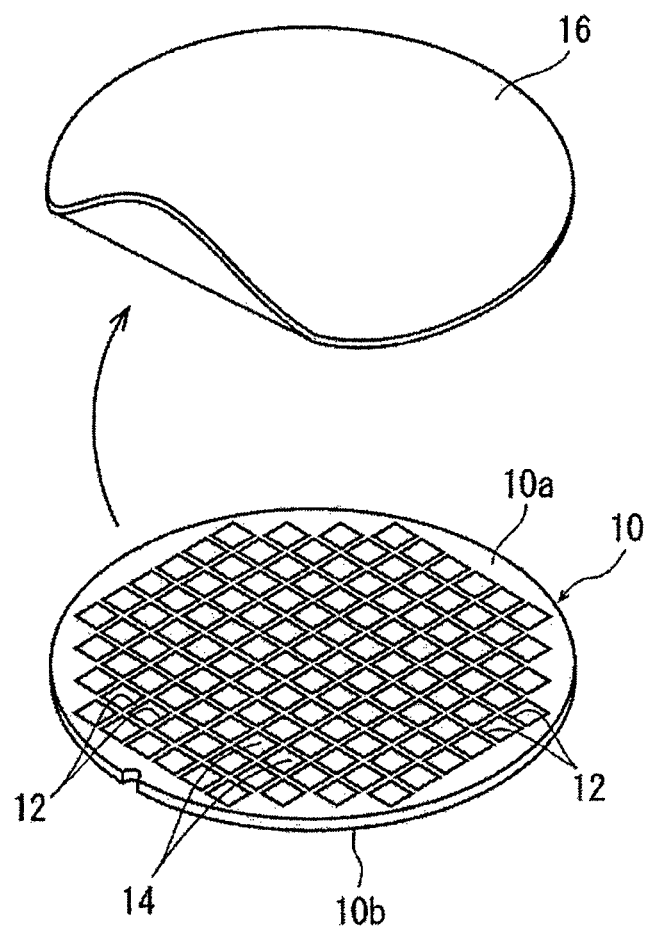
FIG. 3 is a perspective view illustrating the manner in which a protective tape is peeled off the face side of a wafer.
Figure 4A:
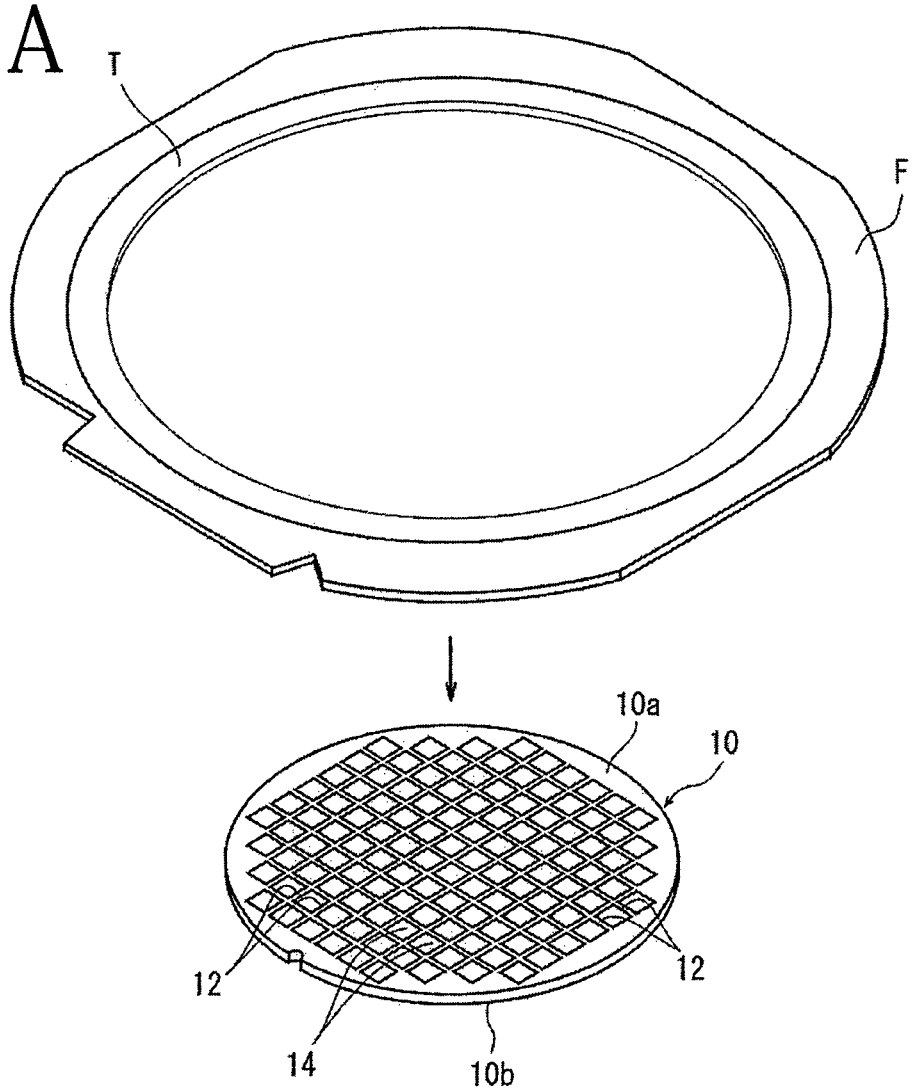
FIG. 4A is a perspective view illustrative of a frame supporting step.
Figure 4B:
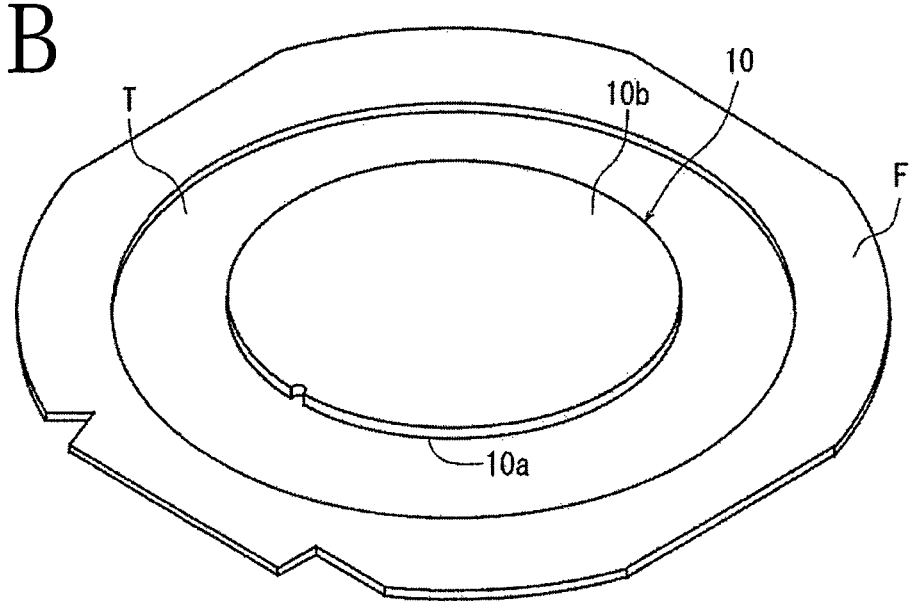
FIG. 4B is a perspective view illustrating the wafer after the frame supporting step has been carried out thereon.

The reverse side grinding step is followed by a frame supporting step. In the frame supporting step, as illustrated in FIG. 3, first, the protective tape 16 is peeled off from the face side 10a of the wafer 10 on which reverse side grinding step has been completed. Then, as illustrated in FIG. 4A, an adhesive tape T is applied to the face side 10a of the wafer 10 from which the protective tape 16 has been peeled off, and has its outer peripheral portion applied to an annular frame F that has an opening for accommodating the wafer 10 therein, so that the wafer 10 is supported on the annular frame F through the adhesive tape T. Specifically, the face side 10a of the wafer 10 is now supported on the annular frame F through the adhesive tape T. With the wafer 10 thus supported on the annular frame F, the entire assembly is turned upside down, exposing the reverse side 10b of the wafer 10 upwardly through the opening of the annular frame F, as illustrated in FIG. 4B, whereupon the frame supporting step is completed.

Figure 5A:
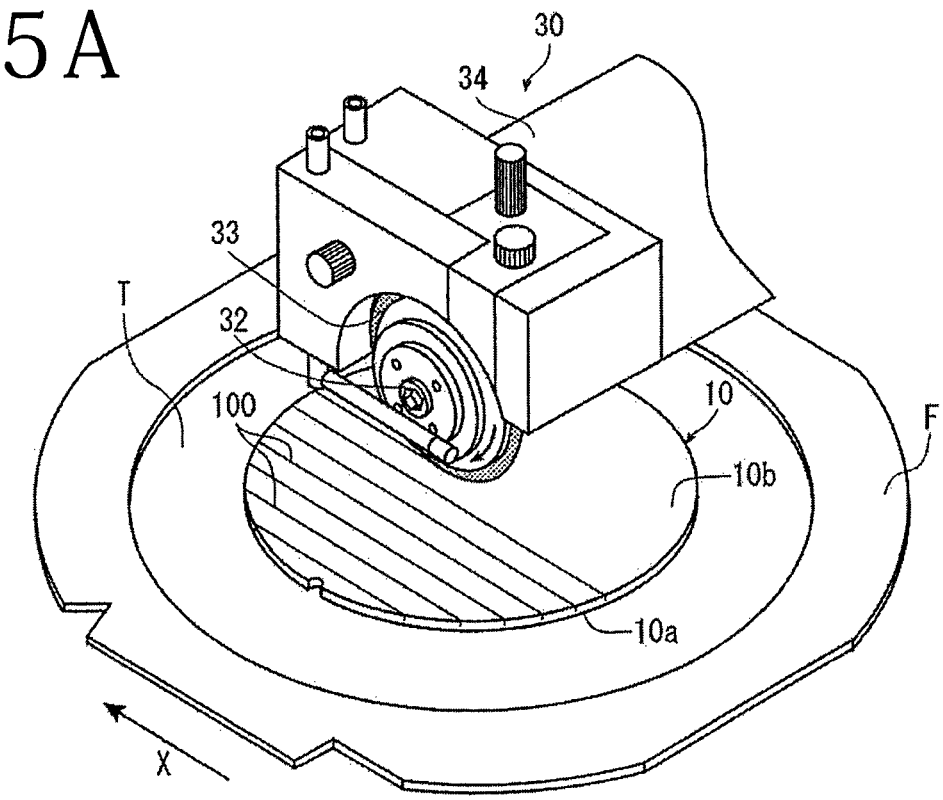
FIG. 5A is a perspective view illustrative of a cut groove forming step.

After the frame supporting step, as illustrated in FIG. 5A, the wafer 10 is carried to cutting means 30 of a cutting apparatus for being processed in a cut groove forming step. The wafer 10 is then placed on the holding surface of a chuck table, not illustrated, of the cutting apparatus, while the face side 10a to which the adhesive tape T is applied is facing downwardly. The wafer 10 is held under suction on the chuck table. The cutting apparatus should preferably have a plurality of, e.g., four, clamps disposed around the chuck table for gripping the annular frame F in position with respect to the chuck table. The annular frame F is drawn downwardly to a position lower than the holding surface of the chuck table on which the wafer 10 is placed.

Figure 5B:
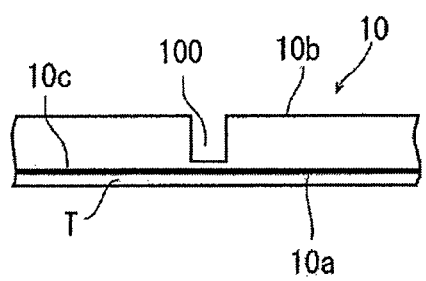
FIG. 5B is an enlarged fragmentary cross-sectional view of the wafer with a cut groove formed therein.
Figure 5C:
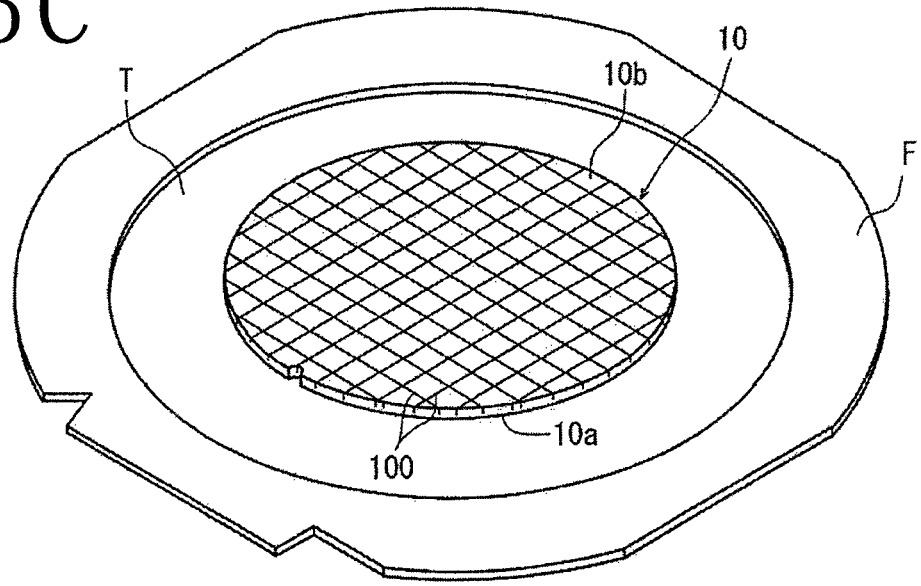
FIG. 5C is a perspective view of the wafer after the cut groove forming step has been carried out along all projected dicing lines on the wafer.

The cutting means 30 has a vertically movable spindle housing 34 that holds a cutting blade 33 fixed to the distal end of a spindle 32 which is rotatably mounted in the spindle housing 34. In preparation for a process of forming cut grooves in the wafer 10 with the cutting means 30, an alignment process is carried out to position the cutting blade 33 in alignment with one of the streets 12 on the wafer 10 on the basis of image data acquired by image capturing means, not illustrated, that captures an image of the face side 10a of the wafer 10 with an infrared radiation applied from the reverse side 10b and transmitted through the wafer 10 to the face side 10a. After the alignment process has been carried out, the cutting blade 33 is lowered while rotating at a high speed, based on positional information obtained by the alignment process, to cut into the wafer 10 on the chuck table along the aligned street 12. The chuck table and the cutting blade 33 are relatively moved, i.e., processing-fed, in a processing-feed direction represented by the direction indicated by the arrow X. In this manner, as illustrated at an enlarged scale in FIG. 5B, a cut groove 100 is formed in the wafer 10 along the street 12 to a depth terminating short of the face side 10a from the reverse side 10b and a predetermined width of 30 μm, for example. As illustrated in FIG. 5B, the wafer 10 includes a low-k film 10c formed therein near the face side 10a thereof, and the depth of the cut groove 100 is such that it does not reach the low-k film 10c. The chuck table is rotatable about its own axis so that the direction of the wafer 10 can freely be changed with respect to the cutting blade 33 by rotating the chuck table. Accordingly, the cutting means 30 can form cut grooves 100 in the wafer 10 from the reverse side 10b along all the streets 12. When the cut groove forming step is finished, the cut grooves 100 are formed in the wafer 10 as illustrated in FIG. 5C.

Figure 6A:
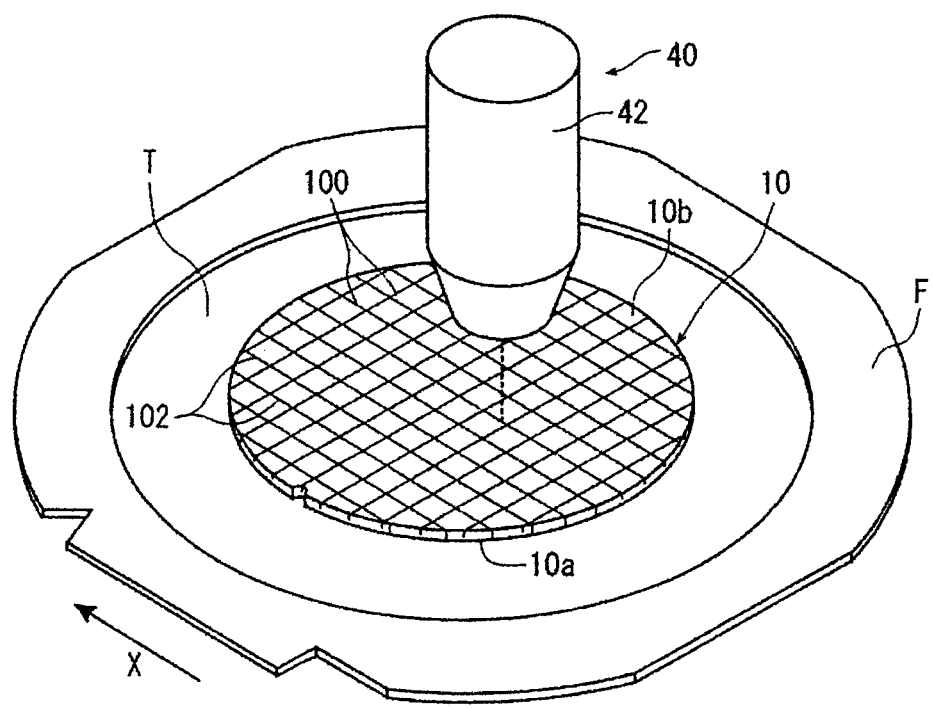
FIG. 6A is a perspective view illustrative of a cutting step.

The cut groove forming step is followed by a cutting step in which the wafer 10 is cut fully across its thickness along the streets 12. In the cutting step, specifically, the wafer 10 is carried to a laser processing apparatus, not illustrated in its entirety, having laser processing means 40 illustrated in FIG. 6A. The wafer 10 is then placed on the holding surface of a chuck table, not illustrated, of the laser processing apparatus, while the face side 10a with the adhesive tape T applied thereto is facing downwardly. The wafer 10 is held under suction on the chuck table. The laser processing apparatus may also have a plurality of, e.g., four, clamps disposed around the chuck table for gripping the annular frame F in position with respect to the chuck table.

Figure 6B:
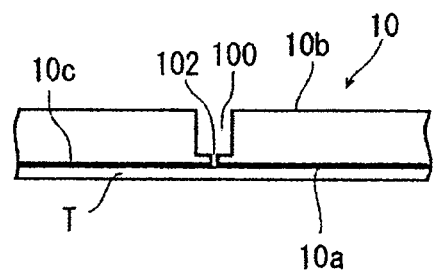
FIG. 6B is an enlarged fragmentary cross-sectional view of the wafer after the cutting step has been carried out thereon.

Prior to a process of laser-processing the wafer 10 with the laser processing means 40, an alignment process is carried out to position a laser head (beam condenser) 42 of the laser processing means 40 in alignment with one of the streets 12 on the wafer 10 on the basis of image data acquired by image capturing means, not illustrated. Subsequently to the alignment process has been carried out, the laser head 42 applies a laser beam to the reverse side 10b of the wafer 10 on the chuck table along the streets 12 on the basis of positional information obtained by the alignment process, and the chuck table and the laser head 42 are relatively moved, i.e., processing-fed, in a processing-feed direction represented by the direction indicated by the arrow X. In this manner, as illustrated at an enlarged scale in FIG. 6B, a severed region 102 is formed in the wafer 10 along the street 12, completely severing the bottom of the cut groove 100, or more specifically, the portion of the wafer 10 from the bottom surface of the cut groove 100 across the low-k film 10c to the face side 10a of the wafer 10 along the street 12. The chuck table is freely movable relatively to the laser head 42 to change its position with respect to the laser head 42 by position changing means, not illustrated, so that the direction of the wafer 10 can freely be changed with respect to the laser head 42 by actuating the position changing means. Accordingly, the laser processing means 40 can form severed regions 102 in the wafer 10 along all the streets 12, whereupon the cutting step is completed. The wafer 10 is now divided into individual device chips with the devices 14 disposed individually thereon, separated by the severed regions 102.

In the cutting step, the laser processing apparatus laser-processes the wafer 10 to form the severed regions 102 therein under the following conditions:

Light source: YAG pulse laser
Wavelength: 355 nm (third harmonic of YAG laser)
Output power: 3.0 W
Repetitive frequency: 20 kHz
Feed rate: 100 mm/second The cutting step is followed by a pick-up step. In the method of processing a wafer according to the present embodiment, the wafer 10 in which the severed regions 102 have been formed along the streets 12 in the cutting step has already been supported on the annular frame F through the adhesive tape T, and is ready for the pick-up step to be carried out thereon. The pick-up step is carried out by a pick-up apparatus 50 partly illustrated in FIG. 7. The pick-up apparatus 50 includes a frame holder 51, a plurality of clamps 52 for firmly holding the annular frame F placed on the upper surface of the frame holder 51, and an expansion drum 53 in the form of a hollow cylinder that is open in at least an upper end thereof, for expanding the wafer 10 supported on the annular frame F held by the clamps 52. The frame holder 51 is vertically movably supported by support means 54 that includes a plurality of air cylinders 54a disposed around the expansion drum 53 and a plurality of piston rods 54b extending upwardly from the respective air cylinders 54a and connected to the frame holder 51.

Figure 7:
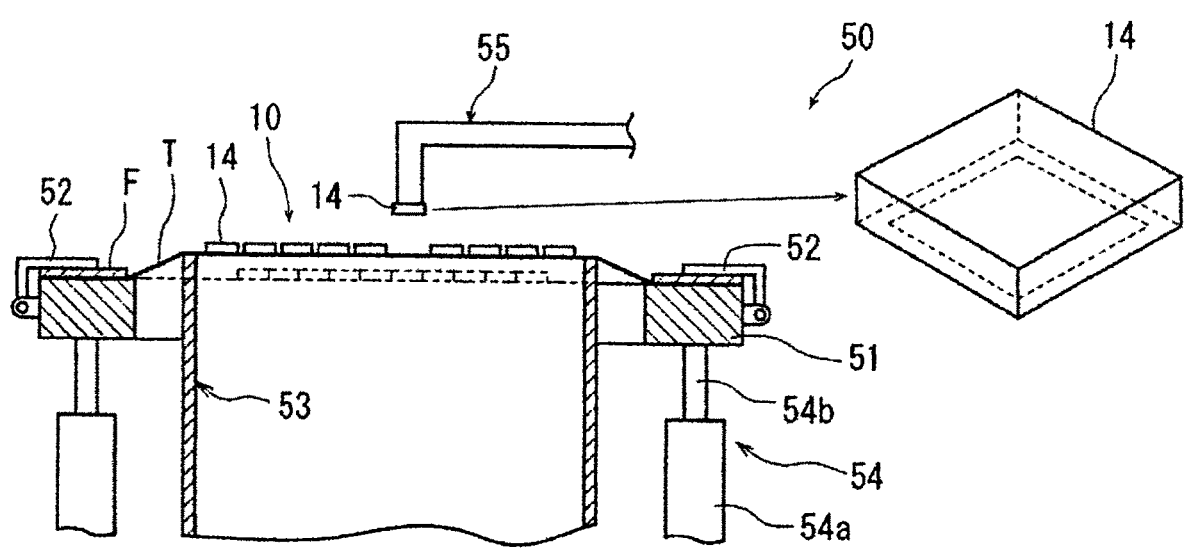
FIG. 7 is a fragmentary side elevational view, partly in cross section, illustrative of a pick-up step.

The expansion drum 53 has its diameter smaller than the inside diameter of the annular frame F and larger than the outside diameter of the wafer 10 applied to the adhesive tape T. As illustrated in FIG. 7, the pick-up apparatus 50 can alternatively take different positions with respect to the frame holder 51, i.e., a position indicated by the broken lines where the upper surface of the frame holder 51 and the upper end of the expansion drum 53 lie flush with each other, and a position indicated by the solid lines where the upper end of the expansion drum 53 is higher than the upper surface of the frame holder 51 after the frame holder 51 has been lowered by the support means 54.

When the frame holder 51 is lowered to relatively move the upper end of the expansion drum 53 from the broken-line position to the solid-line position where the upper end of the expansion drum 53 is higher than the upper surface of the frame holder 51, the adhesive tape T applied to the annular frame F is expanded radially outwardly by being pushed by the upper end of the expansion drum 53. As a result, radially outward tensile forces are exerted on the wafer 10 applied to the adhesive tape T, spacing the individual device chips with the respective devices 14 thereon from each other across and along the severed regions 102 formed along the streets 12 in the cutting step. While the individual device chips are being thus spaced from each other, a pick-up collet 55 of the pick-up apparatus 50 is actuated to attract and pick up the device chips through their reverse sides under suction, one at a time. The pick-up collet 55 carries the picked-up device chip directly to a bonding step in which the face side of the device chip is bonded to a wiring board. The pick-up process is now completed, whereupon the method of processing a wafer according to the present embodiment is completed.

As can be understood from the embodiment illustrated above, the present invention offers various advantages. For example, since the cut grooves are formed in the wafer from the reverse side thereof and then the laser beam is applied to the wafer from the reverse side thereof to completely sever the wafer along the streets, there are no laser-processed grooves in the wafer when the cut grooves are formed, and hence cutting blade is prevented from being displaced or slanted and unevenly worn.

As the wafer is completely severed along the streets by the laser beam applied to the wafer from the reverse side thereof along the cut grooves formed in the previous step, no debris tends to be deposited on the face sides of the devices on the wafer, and hence there is no need to deposit a protective film on the wafer. Furthermore, since it is not necessary to form laser-processed grooves in the wafer to a width commensurate with the width of the cutting blade, the problem of a reduced flexural strength of the devices is avoided which would otherwise result from remaining thermal stresses developed in the wafer by a plurality of laser beams applied thereto.

Moreover, after the cut grooves have been formed in the wafer from the reverse side thereof by the cutting blade, the cutting step is performed to completely sever the wafer along the streets by applying the laser beam to the wafer along the cut grooves. Consequently, it is not necessary to form wide projected dicing lines or streets on the wafer, so that the problem of a reduced number of devices produced from the wafer due to the wide streets is eliminated. In particular, inasmuch as the laser beam is applied to the wafer from the reverse side thereof to sever the wafer portions remaining after the cut grooves have been formed, the problem of an undercut formed in the wafer due to trapped heat developed by the laser beam applied to the wafer from the face side thereof and transmitted through the passivation film is also solved.

According to the present invention, before the cut groove forming step is carried out, the frame supporting step is carried out to peel off the protective tape 16 from the face side 10a of the wafer 10 and supporting the wafer 10 on the annular frame F through the adhesive tape T. Consequently, no other protective tape does not have to be used all the way from the cut groove forming step to the pick-up step, and the wafer 10 is severed into the individual devices 14 while it is being supported on the annular frame F through the adhesive tape T, directly followed by the pick-up step. The subsequent process of picking up the devices 14 from the adhesive tape T and then bonding the face sides of the devices 14 to wiring boards is thus carried out efficiently with ease.

The present invention is not limited to the above embodiment, but various changes and modifications may be made therein. For example, in the above embodiment, when the reverse side grinding step, the cut groove forming step, and the cutting step are to be carried out on the wafer 10, the wafer 10 is carried to and placed on the respective chuck tables of the grinding apparatus, the cutting apparatus, and the laser processing apparatus, one at a time, and then the above steps are performed on the wafer 10 thus held on the respective chuck tables. However, the grinding apparatus, the cutting apparatus, and the laser processing apparatus may be put together in a compound processing apparatus in which the wafer 10 may be held on a single chuck table and the chuck table may be moved successively to those apparatuses to process the wafer 10 therein. Such a modification makes it unnecessary to place the wafer 10 on different chuck tables one at a time.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer to divide the wafer into individual device chips, the wafer being demarcated into a plurality of devices by a plurality of crossing projected dicing lines and having a low-k film formed on a face side, the method comprising:
   a protective member laying step of placing a protective member on the face side of the wafer;
   a reverse side grinding step of grinding a reverse side of the wafer to thin the wafer after performing the protective member laying step;
   a frame supporting step of peeling off the protective member from the face side of the wafer, applying an adhesive tape to the face side of the wafer, and applying an outer peripheral portion of the adhesive tape to an annular frame which has an opening for accommodating the wafer therein, so that the wafer is supported on the annular frame through the adhesive tape after performing the reverse side grinding step;
   a cut groove forming step of positioning a cutting blade in alignment with the projected dicing lines one at a time on the reverse side of the wafer, and cutting the wafer with the cutting blade to form cut grooves in the wafer which terminate at a predetermined depth in a thickness direction of the wafer, short of the face side thereof after performing the frame supporting step;
   a step of forming individual device chips by cutting completely through the wafer and the low-k film by applying a laser beam to the wafer from the reverse side thereof along the cut grooves, thereby completely cutting through the low-k film from the predetermined depth to the face side of the wafer; and
   a pick-up step of picking up the individual device chips from the adhesive tape supported on the annular frame after performing the cutting step.

2. The method of processing a wafer as defined in claim 1, further comprising increasing the distance between adjacent individual device chips by exerting a radially outward tensile force on the adhesive layer.

* * * * *